US005351166A

United States Patent [19]

Kang

[11] Patent Number: 5,351,166

[45] Date of Patent: Sep. 27, 1994

[54] COOLING APPARATUS OF MAGNETRONS

[75] Inventor: Seong T. Kang, Seoul, Rep. of Korea

[73] Assignee: Goldstar Co., Ltd., Rep. of Korea

[21] Appl. No.: 998,374

[22] Filed: Dec. 30, 1992

[30] Foreign Application Priority Data

Dec. 30, 1991 [KR] Rep. of Korea ............... 25014/1991

[51] Int. Cl.$^5$ ............................................... H05K 7/20

[52] U.S. Cl. ................................... 361/690; 165/80.3; 165/908; 174/16.3; 219/757; 361/697

[58] Field of Search ................ 219/10.55 R; 174/16.3; 165/80.3, 908; 361/382, 383, 384, 386–389, 689, 690, 694, 695, 697, 704, 707, 709, 718, 722

[56] References Cited

U.S. PATENT DOCUMENTS

| | | | |
|---|---|---|---|
| 3,457,988 | 7/1969 | Meyerhoff | 165/80.3 |
| 3,916,435 | 10/1975 | Camplin | 165/80.3 |
| 4,091,252 | 5/1978 | Koinoma | 219/10.55 R |
| 4,812,617 | 3/1989 | Takeuji | 219/10.55 R |
| 5,009,263 | 4/1991 | Seshimo | 165/908 |
| 5,031,693 | 7/1991 | VanDyke | 165/166 |
| 5,087,853 | 2/1992 | Oguro | 313/45 |
| 5,103,374 | 4/1992 | Azar | 165/80.3 |

FOREIGN PATENT DOCUMENTS

| | | | |
|---|---|---|---|
| 662743 | 5/1965 | Belgium | 174/16.3 |

*Primary Examiner*—Gerald P. Tolin

*Attorney, Agent, or Firm*—Ostrolenk, Faber, Gerb & Soffen

[57] ABSTRACT

Cooling apparatus of a magnetron having a plurality of embossed cooling fins for radiating high temperature heat generated by an anode of the magnetron. Each of the cooling fins includes an anode support boss for tightly receiving and supporting the anode, a pair of erected walls being provided at both sides of the cooling fin, and a plurality of embossments for causing cooling airflow to be forced toward the rear surface of the anode and providing a cooling passage. These embossments are provided between the anode and the erected walls in order to symmetrical to each other with respect to the cooling airflow. The ambossments comprise a plurality of protruded embossments provided at a side of the cooling fin and a plurality of depressed embossments provided at the other side of the cooling fin. The protruded and depressed embossments have an interval which is gradually shortened such that it is minimized at the rear of the anode. In accordance with this invention, the cooling air is forced toward the rear surface of the anode and, as a result, the separation region of the rear surface of the anode is remarkably reduced. The friction between the cooling air and the cooling fins is increased due to the embossments, thereby improving the cooling effect of the magnetron.

5 Claims, 4 Drawing Sheets

COOLING APPARATUS OF MAGNETRONS

BACKGROUND OF THE INVENTION

1. Field of the invention

The present invention relates in general to magnetrons. Note particularly, the present invention relates to apparatus for cooling the magnetron of which cooling fins are provided, in order to improve the cooling effect of the magnetron, with a plurality of protruded and depressed embossments individually.

2. Description of the Prior Art

As well known to those skilled in the art, known microwave ovens or similar heating systems are generally provided with individual magnetrons for generating microwave. In order to cool the magnetron, the microwave oven also includes forced air-cooled type cooling apparatus of which a plurality of cooling fins are mounted on the outer surface of an anode of the magnetron.

With reference to FIG. 1 showing a representative embodiment of the known magnetron suitable used for microwave ovens, the magnetron includes an anode 1 for generating microwave as well as high temperature heat. The microwave generated by the anode 1 is in turn outputted from an microwave output part 5. Above and below the anode 1, upper and lower permanent magnets 6 are arranged in order to form a magnetic field in the magnetron. Here, the high temperature heat of the anode 1 may cause the magnetron to be heated and, as a result, to be troubled. Thus, the magnetron further includes known cooling apparatus for removing the high temperature heat of the anode 1. This known cooling apparatus comprises a plurality of stepped cooling fins 2 which are mounted on the outer surface of the anode 1 in order to provide enlarged cooling surface for radiating the heat of the anode 1 therefrom. This known cooling apparatus further includes a yoke 3 for guiding the cooling air to the inside of the magnetron and a fan blower 4 for forcedly sending the cooling air to the inside of the magnetron.

In the above magnetron, when the resonator of the magnetron, i.e., the anode 1 is applied with an electric current having a predetermined oscillation frequency, the anode 1 emits thermions and, as a result, generates microwave of which a part is in turn applied to the microwave output part 5 to be outputted therefrom and the other in the form of thermal loss of the anode 1 is transmitted to the outside of the anode 1. Here, the high temperature heat, i.e., the thermal loss of the anode 1 is first transmitted to the outer surface of the anode 1, and thereafter, radiated to the outside of the magnetron through the plurality of cooling fins 2 mounted on the outer surface of the anode 1. At this time, the cooling air which is sent to the inside of magnetron by the fan blower 4 is circulated in the magnetron in such manner that it passes through the spaces between the yoke 3 and the cooling fins 2 as well as the spaces between adjacent fins 2. In this respect, the known cooling apparatus of the magnetron prevents overheat of the anode 1 and, as a result, deterioration of the permanent magnets 6 caused by the overheat of the anode 1.

However, the known cooling apparatus has a pressure difference between the side and the rear of the anode 1 as depicted in FIG. 2, thereby causing the cooling air passing between the adjacent cooling fins 3 to be forced outwards from the rear of the anode 1. In this regard, the cooling airflow E is deflected from its desired flow direction and this causes separation of the airflow E from the rear surface of the anode 1.

Such a separation causes deficient contact of the cooling air with the rear surface of the anode 1 and, as a result, prevents the rear surface of the anode from being sufficiently cooled by the cooling air. Therefore, a separation region is inevitably formed on the rear surface of the anode 1. In this regard, there is a temperature difference of about several °C. to several ten °C. between the front surface and the rear surface of the anode 1. This temperature difference causes the anode 1 to be thermally deformed and, as a result, reduces the using life of the magnetron.

In addition, the cooling fins, while increasing the amount of cooling air circulation since the cooling air can smoothly pass by them thanking for their flat shapes, nevertheless reduces the relative friction of the cooling air with respect to them. In this regard, it is required to increase the friction between the cooling air and the cooling fins 2 in order to improve the cooling effect of the magnetron within an extent capable of maintaining a predetermined conductance.

SUMMARY OF THE INVENTION

It is, therefore, an object of the present invention to provide cooling apparatus of a magnetron in which the above problems can be overcome, and of which cooling fins mounted on an anode are provided at their surfaces with a plurality of embossments individually, thereby reducing the separation region of the rear surface of the anode, increasing the friction between the cooling air and the cooling fins and, as a result, improving the cooling effect of the magnetron.

In a preferred embodiment of the present invention, the above object can be accomplished by providing cooling apparatus of a magnetron comprising a plurality of cooling fins for radiating high temperature heat generated by an anode of the magnetron, characterized in that each said cooling fin includes: an anode support boss for tightly receiving and supporting the anode; a pair of erected walls being provided at both sides of the cooling fin; and a plurality of embossments for causing cooling airflow to be forced toward the rear surface of the anode and providing a cooling air passage, said embossments being provided between the anode and the erected walls in order to symmetrical to each other with respect to the cooling airflow.

The embossments comprise a plurality of protruded embossments provided at a side of the cooling fin and a plurality of depressed embossments provided at the other side of the cooling fin. The cooling fin further includes a pair of erected parts which are formed between the erected walls and the embossments, respectively, in order to enlarge the heat exchanging surface of the cooling fin.

The plurality of cooling fins of this invention are assembled in such a manner that the protruded embossments of a cooling fin face to the depressed embossments of an adjacent cooling fin in order to form a pair of cooling air passages of a repeatedly enlarged and narrowed shape and a reversed shape between the adjacent cooling fins. These repeatedly enlarged and narrowed cooling air passages cause the cooling air to forcedly sequentially pass through a plurality of nozzles which actively rubbing the surfaces of the cooling fins, thereby increasing the friction between the cooling air and the cooling fins and, as a result, improving the cooling effect of the magnetron.

BRIEF DESCRIPTION OF THE DRAWINGS

The above and other objects, features and other advantages of the present invention will be more clearly understood from the following detailed description taken conjunction with the accompanying drawings, in which:

FIG. 3A to 3C show cooling fins of a preferred embodiment of cooling apparatus of this invention, respectively, in which:

FIG. 3A is a plane view of a cooling fin;

FIG. 3B is a sectioned view of the assembled cooling fins; and

FIG. 3C is a sectioned view of the adjacent cooling fins taken along the section line I—I of FIG. 3A;

FIGS. 4A to 4C show cooling airflows in the cooling apparatus of this invention, respectively, in which:

FIG. 4A is plane view of a cooling fin for showing the cooling airflow passing by the anode on the cooling fin;

FIG. 4B is a sectioned view of the adjacent cooling fins taken along the section line A—A of FIG. 4A; and FIG. 4C is a sectioned view of the adjacent cooling fins taken along the section line B—B of FIG. 4A.

DESCRIPTION OF THE PREFERRED EMBODIMENT

Figure 1:
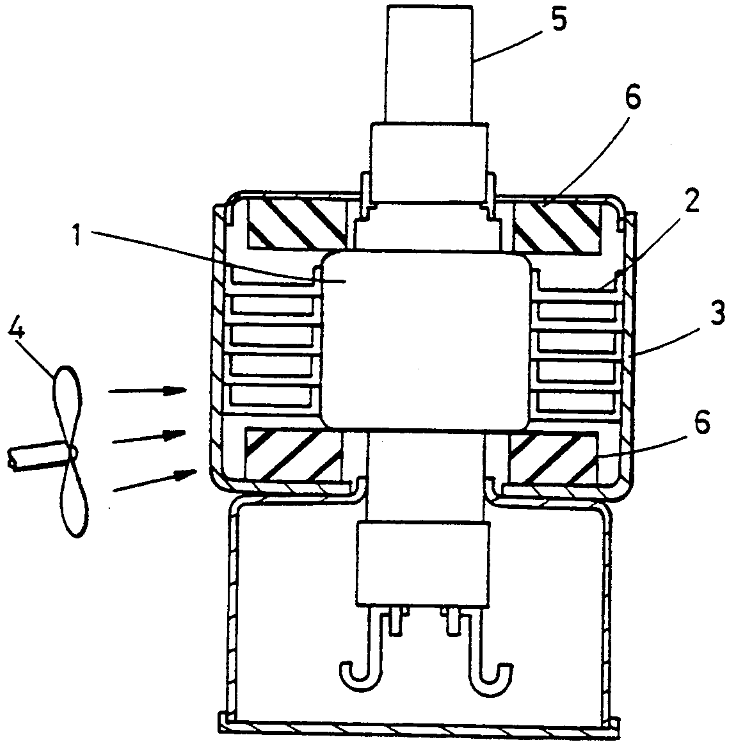
FIG. 1 PRIOR ART
FIG. 1 is a schematic sectioned view of a magnetron having known cooling apparatus.
Figure 2:
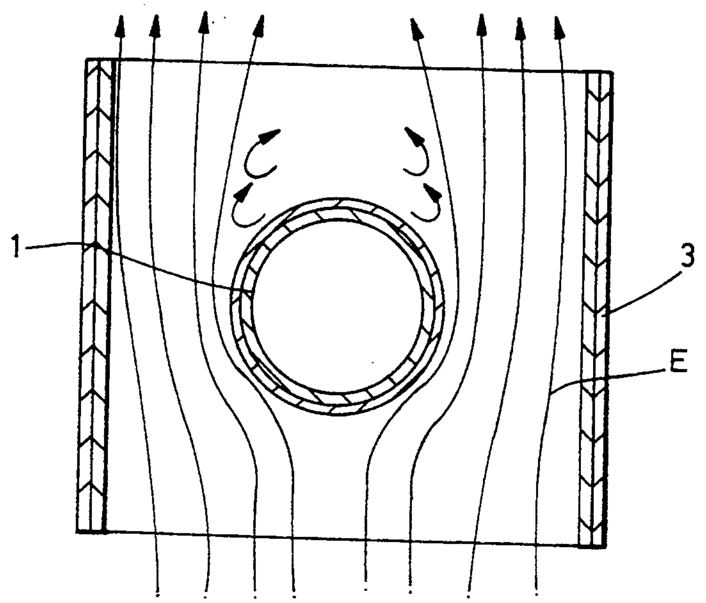
FIG. 2 PRIOR ART
FIG. 2 is a plane view of a cooling fin of the known cooling apparatus for showing the cooling airflow passing by an anode of the magnetron on the cooling fin.
Figure 3A:
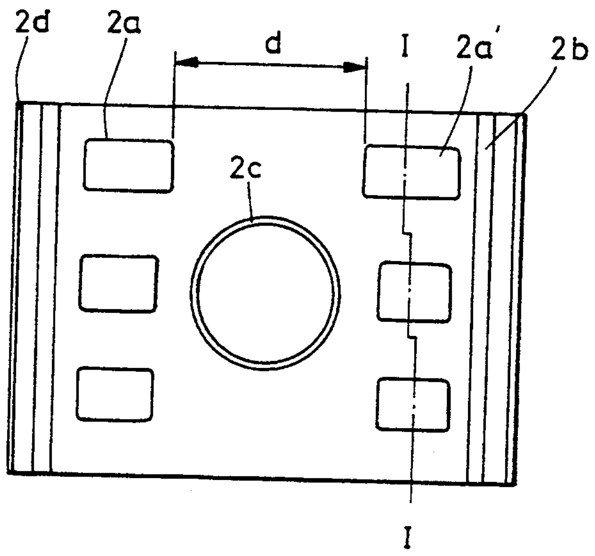
Figure 3C:
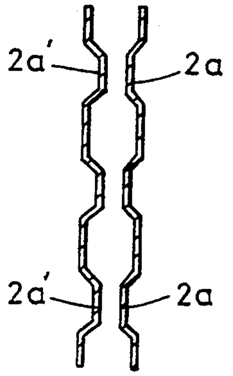

Referring first to FIG. 3A showing a cooling fin of cooling apparatus of this invention, the cooling fin 2 generally having a rectangular shape includes a circular anode support boss 2*c*, which is adapted to support an anode 1 (referred to FIG. 2) of a magnetron which tightly surrounding the anode 1. The cooling fin 2 further includes a pair of erected walls 2*d* for connecting this cooling fin 2 to adjacent cooling fins 2. These erected walls 2*d* are integrally formed with the anode support boss 2*c*.

Figure 3B:
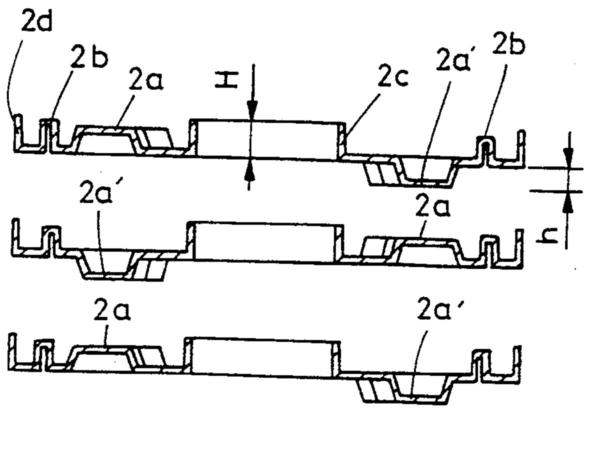

Turning to FIG. 3B showing the assembled cooling fins 2, a cooling fin 2 arranged at the uppermost position is provided at both side flat pans with a plurality of embossments 2*a* and 2*a'* individually in the same direction as that of the cooling airflow. These embossments 2*a* and 2*a'* are provided for the cooling fin 2 in such a manner that they are symmetrical to each other with respect to the anode support boss 2*c* and the protruded embossments 2*a* are formed at the 1 eft side of the boss 2*c*, while the depressed embossments 2*a'* are formed at the right side of the boss 2*c*. Differently from the above uppermost cooling fin 2, another cooling fin 2 adjacent to this uppermost cooling fin 2 has a plurality of depressed embossments 2*a'* at the left side of the boss 2*c* and a plurality of protruded embossments 2*a* at the right side of the boss 2*c*. The plurality of the cooling fins 2 having the aforementioned constructions are assembled in such a manner that the protruded embossments 2*a* of a cooling fin 2 face to the depressed embossments 2*a'* of an adjacent cooling fin 2.

In each of the cooling fins 2, the interval D between a protruded embossment 2*a* and a depressed embossment 2*a'* is gradually shortened such that it is minimized at the rear of the anode 1. In this embodiment, the embossments 2*a* and 2*a'* of the cooling fins 2 preferably have individual general trapezoidal sections. However, please note that the sectioned shapes of the embossments 2*a* and 2*a'* may be changed into other shapes, for example, circular shapes, rectangular shapes, diamond shapes and etc., without limit.

Meanwhile, the height h of the embossments 2*a* and 2*a'* is preferably determined to be less than the height H of the anode support boss 2*c* as shown in FIG. 3B. Hence, there is no interference between the cooling fins 2 when they are combined with the anode 1. In addition, the protruded embossments 2*a*and the depressed embossments 2*a'* are formed to be oriented to opposite directions, i.e., upwards and downwards, with respect to the flat surface of the cooling fin 2 as represented in the drawings. In this regard, when the adjacent cooling fins 2 are assembled in order to cause their protruded embossments 2*a* to face their depressed embossments 2*a'*, a pair of cooling passages of a repeatedly enlarged and narrowed shape and a reversed shape are provided between the adjacent cooling fins 2 at both sides of the anode support bosses 2*c*, respectively.

Additionally, it is preferred to equip each of the cooling fins 2 with a pair of erected parts 2*b* each of which is formed between the erected wall 2*d* and corresponding embossment 2*a* or 2*a'*. These erected parts 2*b* are adapted to enlarge the heat exchanging surface of each cooling fin 2. However, the erected parts 2*b* may be removed from the cooling fin 2 by lengthening the embossments 2*a* and 2*a'* to the erected walls 2*c*, respectively.

Hereinbelow, the operational effect of the cooling apparatus of this invention will be described.

When the anode 1 is applied with an electric current having a predetermined oscillation frequency, the anode 1 emits thermions and, as a result, generates microwave as well as high temperature heat. This heat should be transmitted to the outside of the anode 1 and in turn to the outside of the magnetron by means of the cooling apparatus of this invention. In order to accomplish this object, the fan blower 4 of the cooling apparatus operates in order to forcedly send the cooling air, i.e., outside air, to the inside of the magnet ton through a front part of the magnetron. This cooling air strikes against the front surface of the anode 1, and therefore, causes its flow direction to be deflected outwards as depicted in FIG. 4A. Here, as described above, the cooling fins 2 have individual protruded embossments 2*a* as well as individual depressed embossments 2*a'*, of which the interval D is gradually shortened such that it is minimized at the rear of the anode 1. Due to such construction of the embossments 2*a* and 2*a'* , the cooling air is forced inwards, i.e., toward the rear surface of the anode 1, and this causes the rear surface of the anode 1 to sufficiently contact with the cooling air. In this regard, the heat exchange at the rear surface is normally performed and, as a result, separation region of the rear surface of the anode 1 reduced. Thus, there is no temperature difference between the front surface and the rear surface of the anode 1 and, in this regard, the thermal deformation of the anode 1 can be efficiently prevented.

Figure 4B:
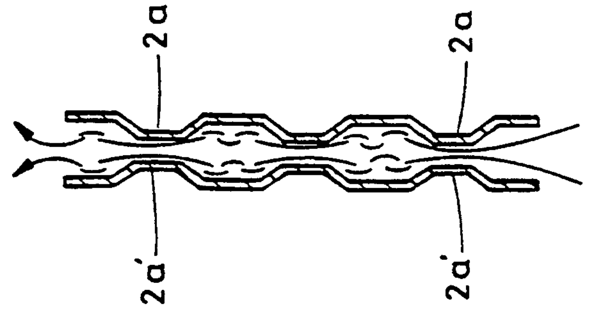
Figure 4A:
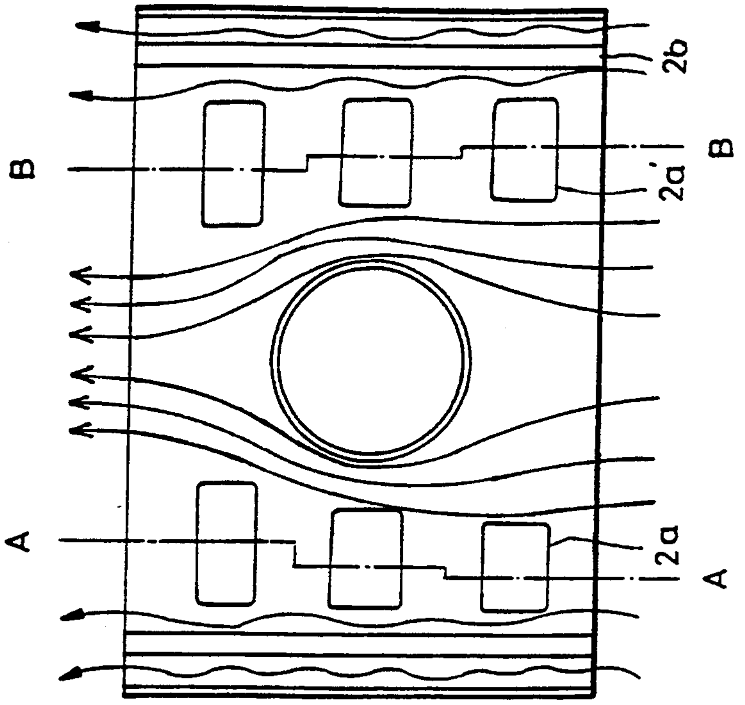
Figure 4C:
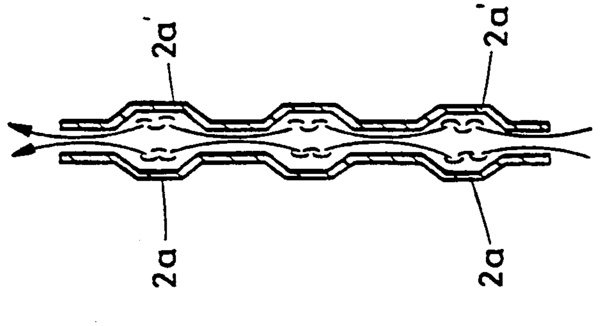

At the same time, a part of the cooling air passes through the pair of cooling air passages of repeatedly enlarged and narrowed shape and reversed shape provided by the facing protruded and depressed embossments 2*a* and 2*a'* of the adjacent cooling fins 2 as shown in FIGS. 4B and 4C. Due to the repeatedly enlarged and narrowed shape and reversed shape of the passages, the cooling air passing through the passages is inevitably repeatedly expanded and compressed and this causes the cooling air to forcedly sequentially pass through a plurality of nozzles. Thus, the cooling air actively rubs the surfaces of the cooling fins 2 and this improves the heat exchanging effect between the cooling air and the cooling fins and, as a result, the cooling effect the magnetron.

As described above, the present invention provides cooling apparatus of a magnetron which reduces the separation region of an anode due to cooling fins which are provided with a plurality of protruded and depressed embossments between which the interval D is gradually shortened such that it is minimized at the rear of the anode and which form the cooling air passages of repeatedly enlarged and narrowed shapes. In this regard, the cooling uniformly cools the front surface and the rear surface of the anode and, as a result, prevents the thermal deformation of the anode due to the temperature difference between the front and rear surfaces of the anode. Furthermore, this cooling apparatus causes the cooling air to forcedly sequentially pass through a plurality of nozzles as actively rubbing the surfaces of the cooling fins 2. Thus, this invention allows the operational performance and cooling effect of the magnetron to be remarkably improved and lengthens the useful life of the magnetron.

Although the preferred embodiments of the present invention have been disclosed for illustrative purposes, these skilled in the art will appreciate that various modifications, additions and substitutions are possible, without departing from the scope and spirit of the invention as disclosed in the accompanying claims.

What is claimed is:

1. Cooling apparatus for a magnetron comprising an anode and a plurality of interconnecting cooling fins for radiating high temperature heat generated by the anode of the magnetron, characterized in that each said cooling fin includes:

an anode support boss tightly receiving and supporting said anode;

a pair of erected walls provided at both sides of said cooling fin; and a plurality of embossments on said fin for causing cooling airflow to be forced toward a rear surface of said anode and providing a cooling air passage, said embossments being provided between said anode support boss and said erected walls, and said embossments being disposed in pairs which are symmetrical to each other on opposed sides of said anode support boss, and each said pair of embossments being separated by a distance which gradually decreases for successive ones of said pairs so that it is shortest at a rear side of said anode.

2. Cooling apparatus according to claim 1, wherein each said cooling fin further includes a pair of erected parts being formed between said erected walls and said embossments, respectively, said erected parts being adapted to enlarge the heat exchanging surface of said cooling fin.

3. Cooling apparatus according to claim 1, wherein said embossments comprise a plurality of protruded embossments provided at a first side of said cooling fin and a plurality of depressed embossments provided at a second side of said cooling fin.

4. Cooling apparatus according to claim 3, wherein said protruded and depressed embossments have a sectional shape selected: from trapezoidal, circular, rectangular and diamond shapes.

5. Cooling apparatus according to claim 3, wherein said plurality of cooling fins are assembled in such a manner that the protruded embossments of a cooling fin face to the depressed embossments of an adjacent cooling fin in order to cause said cooling air to forcedly sequentially pass through a plurality of nozzles as actively rubbing the surfaces of said cooling fins.

* * * * *